(12) United States Patent  
Pryor

(10) Patent No.: US 6,447,693 B1
(45) Date of Patent: *Sep. 10, 2002

(54) SLURRIES OF ABRASIVE INORGANIC OXIDE PARTICLES AND METHOD FOR POLISHING COPPER CONTAINING SURFACES

(75) Inventor: James Neil Pryor, West Friendship, MD (US)

(73) Assignee: W. R. Grace & Co.-Conn., Columbia, MD (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/551,935

(22) Filed: Apr. 20, 2000

Related U.S. Application Data

(63) Continuation-in-part of application No. 09/422,384, filed on Oct. 21, 1999, now Pat. No. 6,294,106
(60) Provisional application No. 60/105,141, filed on Oct. 21, 1998.

(51) Int. Cl.[7] .............................................. C09K 13/00
(52) U.S. Cl. ...................................... 252/79.1; 438/692
(58) Field of Search ...................... 252/79.1, 79.2–79.5; 438/689, 690, 691, 692, 693

(56) References Cited

U.S. PATENT DOCUMENTS

| | | | |
|---|---|---|---|
| 3,527,028 A | 9/1970 | Oswald | |
| 4,226,743 A | 10/1980 | Seese et al. ................ 252/453 |
| 4,304,575 A | 12/1981 | Payne ......................... 51/308 |
| 4,356,107 A | 10/1982 | Payne ...................... 252/313 S |
| 4,463,108 A | 7/1984 | Wagner et al. .............. 523/216 |
| 5,340,370 A | * 8/1994 | Cadien et al. ................ 51/308 |
| 5,342,876 A | 8/1994 | Abe et al. ................... 524/493 |
| 5,527,423 A | 6/1996 | Neville et al. ........... 156/636.1 |
| 5,543,126 A | 8/1996 | Ota et al. ................... 423/263 |
| 5,700,838 A | 12/1997 | Dickens et al. .............. 514/575 |
| 5,769,689 A | 6/1998 | Cossaboon et al. ........... 451/41 |
| 5,800,577 A | 9/1998 | Kido ........................... 51/307 |
| 5,951,724 A | * 9/1999 | Hanawa et al. ............... 51/309 |
| 5,980,775 A | * 11/1999 | Grumbine et al. ......... 252/79.1 |
| 6,027,669 A | * 2/2000 | Miura et al. .............. 252/518.1 |
| 6,077,581 A | * 6/2000 | Kuramochi et al. ........ 428/323 |
| 6,294,106 B1 | * 9/2001 | Pryor ........................ 252/79.1 |

FOREIGN PATENT DOCUMENTS

| | | | | |
|---|---|---|---|---|
| EP | 0773270 | 5/1997 | ............ | C09G/1/02 |
| EP | 844290 | 5/1998 | ............ | C09G/1/02 |
| EP | 0846742 | 6/1998 | ............ | C09G/1/02 |
| EP | 896042 | 2/1999 | ............ | C09G/1/02 |
| EP | 967260 | 12/1999 | ............ | C09G/1/02 |
| WO | WO 99/61244 | 12/1999 | ........... | B32B/19/00 |
| WO | WO 00/13218 | 3/2000 | ......... | H01L/21/306 |

* cited by examiner

Primary Examiner—Benjamin L. Utech
Assistant Examiner—Kin-Chan Chen
(74) Attorney, Agent, or Firm—Charles A. Cross

(57) ABSTRACT

Oxidizing agents are added to slurries of inorganic oxides which have been heated, e.g., autoclaved, to produce abrasive slurries which impart relatively equal polishing rates for conductive metal and insulating layers used to make semiconductor chips. A relatively flexible abrasive slurry in terms of its abrasivity is also provided by this slurry, thereby permitting the modification of a copper polishing slurry's abrasivity when a new insulating material is used to make a chip. When using this method, an increase in particle abrasivity of this slurry can be correlated with a decrease in particle surface area as determined by $N_2$ adsorption (BET method) and abrasivity can be increased (or decreased) by heating the slurry to produce particles with a surface area determined to have the abrasivity desired. The method is particularly suitable for preparing silica-based abrasive slurries and the slurries prepared are particularly useful for polishing chips made with copper conductive circuits and silica-based insulating layers.

14 Claims, 3 Drawing Sheets

Polished Wafer
(High Cu Polish Selectivity)

Polished Wafer
(1:1:1 Polish Selectivity)

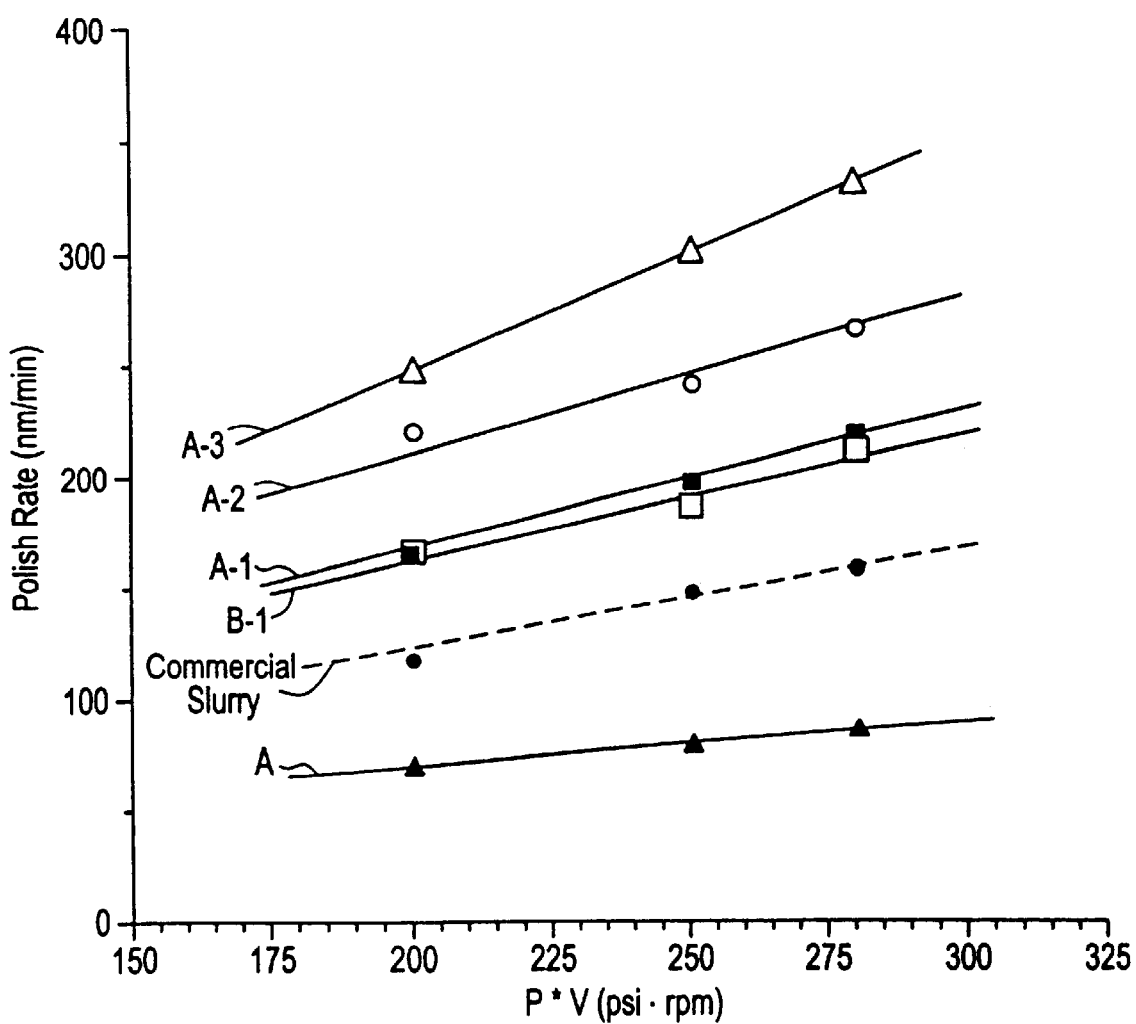

SLURRIES OF ABRASIVE INORGANIC OXIDE PARTICLES AND METHOD FOR POLISHING COPPER CONTAINING SURFACES

RELATED APPLICATION

This application is a continuation-in-part of Ser. No. 09/422,384, filed Oct. 21, 1999, now U.S. Pat. No. 6,294,106 B1, which is a continuation-in-part of provisional application 60/105,141, filed Oct. 21, 1998, the contents of which are incorporated by reference.

BACKGROUND OF THE INVENTION

The field of this invention relates to slurries of abrasive inorganic oxide particles. In particular, it relates to slurries of inorganic oxide particles used to planarize or polish electronic chips, especially chips containing conductive metal circuits and silica-based insulating layers. Copper is increasingly being used as a conductive layer, and tetraethoxysilane (TEOS) dielectric is widely used as an insulating layer in such circuits.

The process employing these abrasive slurries is known as a chemical/mechanical planarization (or polishing) process, also known as "CMP". Mechanical polishing is imparted by the abrasivity of the inorganic oxide particles in the slurry and chemical additives included in the slurry impart an additional effect of facilitating dissolution and removal of the surface being polished.

Electronic chips are polished or planarized because conductive and/or insulating layers are applied in excess during a series of steps needed to create the final circuit of the chip. The damascene process for making electronic chips is an example of when such polishing is used. Briefly, the damascene process applies excess copper onto an insulating layer containing channels that correlate with a desired circuit. Copper fills those channels as well as covers the insulating layer. This excess on the insulating layer, or the so-called "overburden," has to be removed by polishing. It is desired to polish the deposited copper layer in such a manner that the overburden is completely removed before the next layer of material is applied. The additional layers are typically applied by photolithography and the underlying layers need to be sufficiently planarized to maximize the sharpness of focus in the subsequent photolithography steps.

The slurry also must provide uniform polishing across the wafer without undue scratching or pitting of the polished substrate. In conjunction with meeting this requirement, it is also further desirable to maximize polish rates in order to maximize the productivity of high-cost polishing equipment.

The conductive layer must also be removed during the damascene process with minimal "dishing" (see FIGS 1A, 1B and 1C). Dishing can occur during the layer deposition process (FIG. 1A) or as the polishing process reaches the insulating layer and is caused by the conductive layer being removed at a faster rate than the adjacent insulating layer (FIG. 1B). For example, slurries used in CMP processes typically comprise fine sized, i.e., submicron, inorganic abrasive particles. In particular, micronized amorphous silica particles have proven utility in CMP slurries based on their good colloidal stability and uniform polishing with minimal scratching. However, these abrasives generally do not yield equal polishing rates when employed in acidic, oxidizing slurries for polishing chips containing copper. Specifically, slurries prepared with these abrasives impart significantly lower polish rates for a silica-containing insulating layer compared to a copper-containing conducting layer. As a result, copper is removed more quickly, and significant (and undesirable) dishing can occur unless the polishing process is stopped at exactly the moment that the polishing process exposes the insulating layer. By contrast, a slurry with equal polish rates for copper and insulating layer will result in a planar surface even when polishing is continued briefly after the dielectric layer is exposed (FIG. 1C). FIGS. 1A, 1B and 1C also illustrate the use of a barrier layer. A barrier layer is a protective layer applied to the surface of the conductive layer in order to limit diffusion of metal, e.g., copper, into the dielectric layer during chip processing. The presence of a barrier may also play a part in dishing if the barrier polishes at a significantly slower rate than the copper. It alone may even play a part in creating dishing.

As a result of the different removal rates of the above materials, CMP processes using known abrasive slurries generally will not impart uniform polishing across the wafer. Therefore, it is generally desirable, e.g., in a damascene process, to employ a first abrasive slurry to remove most of the copper overburden. These first slurries are primarily effective because they contain aggressive chemical additives, e.g., glycine and hydrogen peroxide mixtures, which accelerate the removal of copper. There are some issues as to when polishing with this first slurry should be stopped. Suffice it to say, many operators stop the process when the barrier layer is first exposed. After polishing with the aggressive slurry, a second slurry which does not contain glycine is employed to finish the polishing on a finer level to ensure copper is completely removed from every location on the chip outside of the conducting line.

Either of the two slurries above, however, tend to cause the dishing effect described above. At least some dishing occurs when the polishing using the first slurry is carried out until the barrier layer is reached and that dishing remains or is even amplified after the second polishing step.

In addition, new insulating and barrier materials are frequently being developed. These new materials will typically have different properties and as a result will show different polishing rates. Accordingly, when these materials are introduced, the operator of the process will either need to adjust the abrasivity of the existing polishing slurry, or completely replace the existing slurry system with another having the appropriate abrasivity. It would be more desirable to adjust the existing slurry than to find a replacement slurry. However, it has been found that modifying conventional slurries for polishing conductive surfaces, e.g., copper, has not resulted in the selectivity desired. Alumina slurries, and fumed silica slurries, have been used in the past to polish copper surfaces.

U.S. Pat. No. 5,527,423 to Neville, et al. discloses examples of such slurries. The '423 patent to Neville et al. discloses CMP slurries comprising fumed silicas or fumed alumina particles dispersed in a stable aqueous medium. Neville also mentions that precipitated alumina can be used. Neville et al. disclose that the particles have a surface area ranging from about 40 m$^2$/g to about 430 m$^2$/g, an aggregate size distribution less than about 1.0 micron and a mean aggregate diameter less than about 0.4 microns. This patent also discusses references that teach the addition of agents, such as hydrogen peroxide, or alkaline materials to CMP slurries. Other patents that disclose CMP slurries containing hydrogen peroxide and/or other acidic or alkaline additives include U.S. Pat. No. 5,700,838 to Feller, et al., U.S. Pat. No. 5,769,689 to Cossaboon, et al., U.S. Pat. No. 5,800,577 to Kidd and U.S. Pat. No. 3,527,028 to Oswald. In general, slurries such as these are based on the concept of selecting an inorganic oxide particle and either relying on the particles' inherent abrasive properties for polishing or by including additional additives to the slurry in order to adjust the abrasive and/or polishing effects imparted by the slurry.

U.S. Pat. No. 4,304,575 to Payne discloses the preparation of aqueous silica sols for use as abrasive materials in mechanically polishing semi-conductor wafers. Payne's method for preparing the sol comprises heating an initial alkaline aqueous silica sol containing a mixture of relatively smaller particles and relatively larger particles. It is stated by Payne that the smaller particles dissolve and redeposit on larger particles thereby producing an aqueous silica sol in which the majority of the silica particles have a size significantly larger than the larger silica particles in the starting mixed sol. Payne's materials are prepared from sols having average particle size less than 100 millimicrons and preferably having final particle size of about 180 millimicrons. A similar disclosure is set forth in U.S. Pat. No. 4,356,107 also to Payne.

It is still desirable to find abrasive slurries which provide relatively equal selectivity among copper and the other various layers used to make electronic chips. It is also desirous to devise methods of making abrasive slurries in such a way that the abrasiveness of the particles can be easily adjusted to meet the polishing requirements at hand without having to resort to modifying the chemical makeup of the slurry or a new starting material for the abrasive particle.

SUMMARY OF THE INVENTION

In this invention, oxidizing agents are combined with slurries of fine, porous, inorganic oxide particles which have been prepared by heating the particles, e.g., in an autoclave, to modify and/or increase the particles' abrasivity. These slurries preferably have a median particle size in the range of 0.1 to about 0.5 microns, and substantially all of the particle size distribution is below one micron. Slurries produced by this heating process (without oxidizing agent) have abrasive properties such that an alkaline slurry (e.g., at pH 10.8) consisting of water and the inorganic oxide particles removes silica at a rate of at least 120 mm/minute at 200 psi·rpm. This measurement was made at a solids content of 12.6% by weight, at a pH of about 10.8 and with a Strasbaugh 6CA polisher with a SUBA 500 pad at a two minute polish time. The oxidizing agents added to these slurries include those known in the art, e.g. hydrogen peroxide. It has also been found that when oxidizing agent is added to slurries of inorganic oxide particles prepared in this fashion, and preferably the pH of the slurry is adjusted appropriately, the resulting slurry polishes copper at a rate which is relatively equal to its rate of polishing conventional insulating and barrier layers.

As mentioned above, autoclaving slurries of the above-mentioned porous particles imparts an increased abrasiveness to the particles. This is reflected in increased removal rates of silica substrate at standard polishing conditions. This increase in particle abrasivity strongly correlates with a decrease in particle surface area as determined by $N_2$ adsorption (BET method). Such a correlation can be used for providing methods of simply modifying the abrasivity of the slurry. It is thought that this increase in particle abrasiveness and associated decrease in particle surface area is attributable to silica transport during the autoclaving process whereby silica is preferentially dissolved from sharply convex surfaces within the porous particle and redeposited at sharply concave surfaces at the junction of silica subunits (ultimate particles) that make up the porous particle. This redeposition should thus strengthen the porous silica particle and increase its abrasivity. The elevated temperatures associated with autoclaving serve to accelerate this dissolution-redeposition process by increasing silica solubility. A similar process takes place in alkaline aqueous suspensions of silica particles held at room temperature or temperatures up to ambient pressure boiling (~100° C.), but much longer times would be required. Therefore abrasivity of the particles in this invention can be modified over a wide range of properties by modifying the heating conditions used to reposition the inorganic oxide within the particles' pore structure. Accordingly, the abrasivity of the particles can be adjusted as new insulating materials are being combined with copper conductive layers.

BRIEF DESCRIPTION OF THE DRAWINGS

FIG. 2 is a graph which illustrates that increasing the severity of heating conditions according to this invention decreases the surface area of the slurried particles as well as increases the abrasiveness of those particles. Results for A1 through A3 are those for slurries prepared according to the invention. The polishing rates from those slurries are compared to the polishing rates from a prior art chemical mechanical polishing slurry containing fumed silica (Rodel ILD 1300) having a BET surface area of 105 $m^2/g$. The polishing rates reported are illustrated by the rate at which silica dielectric material is removed at rates in nanometers per minute at various pressures (psi) and angular velocity rates (rpm) imparted by the polishing equipment. The pressure (P) referenced is the pressure between the polishing pad and the wafer. The velocity (V) referenced is the angular velocity at which the polishing pad is rotated during polishing.

DETAILED DESCRIPTION

Figure 1A:
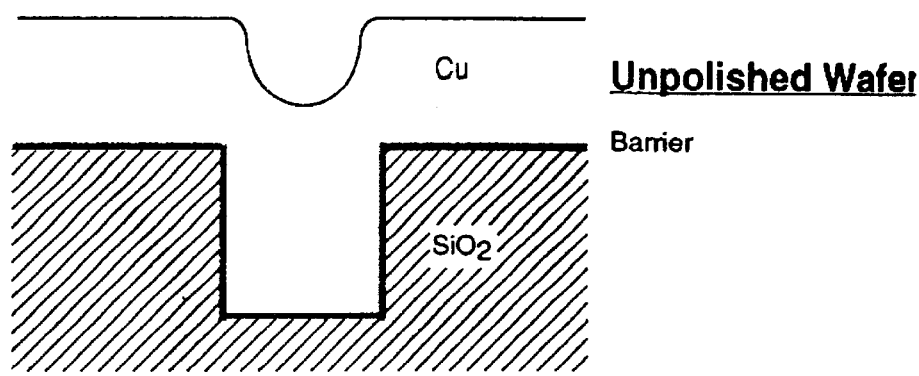
FIGS. 1A, 1B and 1C illustrate the "dishing" effect created by conventional abrasive slurries, as well as illustrate the equal selectivity of the abrasive properties for copper (Cu), silica ($SiO_2$) and barrier (e.g., TaN) possessed by the invention, e.g., equal selectivity.

The initial steps in preparing the slurries of this invention comprise forming a slurry of inorganic oxide particles and then milling and separating particles from the slurry under conditions and in a manner sufficient to create a dispersion comprising particles having a particle size distribution suitable for chemical mechanical polishing, e.g., polishing copper conductive layers and silica insulating layers.

(1) Parent Inorganic Oxide Particles

Inorganic oxides suitable for preparing the slurry include precipitated inorganic oxides and inorganic oxide gels. It is preferable that the inorganic oxide is soluble. Slightly soluble inorganic oxides can be used as well if the heating steps described later below are appropriately adjusted to alter the abrasivity of the selected inorganic oxide at the pH conditions needed to solubilize that inorganic oxide.

The initial inorganic oxide slurries are referred to herein as "parent inorganic oxides," "parent particles" or "parent dispersions". Amorphous silica gels are particularly suitable parent inorganic oxides. The dispersion can also be prepared from mixed inorganic oxides including $SiO_2$. $Al_2O_3$, MgO.

$SiO_2 \cdot Al_2O_3$. Mixed inorganic oxides are prepared by conventional blending or cogelling procedures.

In embodiments comprising gels, the dispersions are derived from porous inorganic oxide gels such as, but not limited to, gels comprising $SiO_2$, $Al_2O_3$, $AlPO_4$, $MgO$, $TiO_2$, and $ZrO_2$. The gels can be hydrogels, aerogels, or xerogels. A hydrogel is also known as an aquagel which is formed in water and as a result its pores are filled with water. A xerogel is a hydrogel with the water removed. An aerogel is a type of xerogel from which the liquid has been removed in such a way as to minimize any collapse or change in the gel's structure as the water is removed. Silica gels commercially available as Syloid® grade gels, e.g., grades 74, 221, 234, 244, W300, and Genesis™ silica gels are suitable parent inorganic oxides.

Methods of preparing inorganic oxide gels are well known in the art. For example, a silica gel is prepared by mixing an aqueous solution of an alkali metal silicate (e.g., sodium silicate) with a strong acid such as nitric or sulfuric acid, the mixing being done under suitable conditions of agitation to form a clear silica sol which sets into a hydrogel, i.e., macrogel, in less than about one-half hour. The resulting gel is then washed. The concentration of inorganic oxide, i.e., $SiO_2$, formed in the hydrogel is usually in the range of about 10 to about 50, preferably between about 20 and about 35, and most preferably between about 30 and about 35 weight percent, with the pH of that gel being from about 1 to about 9, preferably 1 to about 4. A wide range of mixing temperatures can be employed, this range being typically from about 20 to about 50° C.

The newly formed hydrogels are washed simply by immersion in a continuously moving stream of water which leaches out the undesirable salts, leaving about 99.5 weight percent or more pure inorganic oxide behind.

The porosity of preferred parent silica gels can vary and is affected by the pH, temperature, and duration of the water used to wash the gel. Silica gel washed at 65–90° C. at pH's of 8–9 for 15–36 hours will usually have surface areas (SA) of 250–400 and form aerogels with pore volumes (PV) of 1.4 to 1.7 cc/gm. Silica gel washed at pH's of 3–5 at 50–65° C. for 15–25 hours will have SA's of 700–850 and form aerogels with PV's of 0.6–1.3. These measurements are generated by $N_2$ porosity analysis.

Methods for preparing other inorganic oxide gels such as alumina and mixed inorganic oxide gels such as silica/alumina cogels are also well known in the art. Methods for preparing such gels are disclosed in U.S. Pat. No. 4,226,743, the contents of which are incorporated by reference.

Fumed inorganic oxides such as silicas and aluminas can also be chosen as the parent inorganic oxide. The production of fumed silicas and aluminas is a well-documented process and involves the hydrolysis of suitable feedstock vapor, such as silicon tetrachloride or aluminum chloride, in a flame of hydrogen and oxygen.

Once an inorganic oxide is selected for the parent dispersion, a dispersing medium for the slurry of the selected inorganic oxide is chosen. The slurry can be prepared using residual water in inorganic oxide gels which have been drained, but not yet dried, and to which additional water is added. In another embodiment, dried inorganic oxides, e.g., xerogels, are dispersed in water. In general, the parent dispersion should be in a state that can be wet milled. The size of the parent particles only needs to be sufficient such that the mill being used can produce a dispersion having the desired particle size distribution. In most embodiments, the parent dispersion has a median particle size approximately in the range of 10 to 40 microns. In embodiments prepared from a drained inorganic oxide gel, the drained gel may first be broken up into gel chunks and premilled to produce a dispersion of particles in the range of 10 to 40 microns.

(2) Milling and Centrifuging

The parent dispersion is then milled. The milling is conducted "wet", i.e., in liquid media chosen as the dispersing medium. The general milling conditions can vary depending on the feed material, residence time, impeller speeds, and milling media particle size. Suitable conditions and residence times are described in the Examples. These conditions can be varied to obtain the particular particle size distribution, typically below one micron. The techniques for selecting and modifying these conditions are known to those skilled in the art.

The milling equipment used to mill the parent inorganic oxide particles should be of the type capable of severely milling materials through mechanical action. Such mills are commercially available, with hammer and sand mills being particularly suitable for this purpose. Hammer mills impart the necessary mechanical action through high speed metal blades, and sand mills impart the action through rapidly churning media such as zirconia or sand beads. Impact mills can also be used. Both impact mills and hammer mills reduce particle size by impact of the inorganic oxide with metal blades.

The milled slurry is then centrifuged to separate the dispersion into a supernatant phase, which comprises the particles of the final product, and a settled phase, which comprises larger particles which usually are removed to prepare the final abrasive slurry. The supernatant phase is removed from the settled phase, e.g., by decanting, with the supernatant being further processed according to the invention. Conventional centrifuges can be used for this phase separation. A commercially available centrifuge suitable for this invention is identified in the Examples below. In some instances, it may be preferable to centrifuge the supernatant two, three or more times to further remove large particles remaining after the initial centrifuge.

The particles of the slurry recovered from the milling and centrifuging are porous. Silica gel slurries recovered from these steps typically have pore volumes similar to that of the parent inorganic oxide. The porosity of particles recovered from milling and centrifuging of other parent inorganic oxides depends on the inorganic oxide and how it is made. For example, slurries prepared from parent precipitated and fumed inorganic oxides have pore volumes less than that of the parent inorganic oxide.

(3) Heating the Slurry

The centrifuged slurry then is thermally treated under conditions sufficient to alter and adjust the distribution of inorganic oxide within the pore structure of the particles, thereby altering the hardness or abrasiveness of the particles. As indicated earlier, it is believed that in heating conditions such as those in an autoclave, inorganic oxide, e.g., silica, preferentially dissolves from sharply convex surfaces, i.e., those found around the edges (rims) of pores, and redeposits at sharply concave surfaces, such as those at the juncture of ultimate particles which form the pores of the inorganic oxide particles. It is believed that repositioning inorganic oxide to these junctures strengthens the particle structure and as a result creates a harder and more abrasive particle.

Treating the centrifuged slurry in an autoclave is one method of thermal treatment that can be used to make the inventive slurry. By "autoclave" it is meant a pressure reactor which allows for heating of the slurry above the ambient pressure boiling point of the slurry's solution phase. For aqueous slurries, this temperature is about 100° C. The pH of the slurry is adjusted before it is placed in the autoclave and depends on the inorganic oxide selected for the slurry. The pH is adjusted so as to optimize the solubility of the inorganic oxide, thereby decreasing the residence time in the autoclave. However, the pH should not be such that the amount of inorganic oxide solubilized results in unwanted agglomeration and precipitation of secondary inorganic oxide particles when the slurry is cooled to ambient temperature. For example, slurries of silica can be adjusted to a pH of 8–10 prior to thermal treatment and the final pH depends on the substrate which will be planarized by the final slurry.

The autoclave conditions used depend on the desired hardness and the type of inorganic oxide selected for the slurry. It has been found that the more severe the autoclave conditions used, e.g., higher temperature and/or longer residence time in the autoclave, the harder the particles become, thereby increasing the abrasiveness of the particles. For water based slurries, the temperature employed for the autoclave should at least be 100° C. When preparing silica-based abrasive slurries for polishing silicon-containing layers, the slurry can be heated at 120–180° C. for 20–30 hours. In general, silica embodiments become unstable at temperatures higher than 200° C. and should be avoided if surfactants cannot be added to the desired abrasive slurry to reduce the instability. Likewise, heating the inorganic oxide to temperatures below 100° C. require longer heating times to affect redeposition of the inorganic oxide.

As indicated earlier, the abrasiveness of the particles increases and the BET surface area measured for the particles is reduced as heating severity increases. As mentioned earlier, it is believed that the surface area reduction is caused when inorganic oxide dissolves and repositions to the junctures between ultimate particles. The data in the Examples below show that pore volume and surface area are reduced after autoclaving, and it is believed that the repositioning occurs at the expense of pore volume and the surface area associated with the pores lost. Particles having BET surface areas less than 120 $m^2/g$ and preferably less than 60 $m^2/g$ can be prepared according to this invention. The pore volume of these particles is typically in the range of 0.2 to 0.6 cc/g, as measured by nitrogen porosimetry at 0.967 P/Po.

Accordingly, a method for imparting a desired abrasivity for a selected inorganic oxide slurry can be carried out by first identifying an abrasivity or abrasivities as determined by a polishing rate(s) of a substrate, e.g., a silica substrate to be used with a copper conductive surface. BET surface area for those particles is also determined. Then, once an abrasivity or polishing rate has been selected for a substrate to be worked upon, one can reproduce a suitable slurry by preparing a slurry of porous inorganic oxide particles having a measurable BET surface area and then heating the slurry to obtain the particle BET surface area which was identified and associated with the desired abrasivity. As indicated, the surface area referred to herein is that measured using conventional $N_2$ BET surface area techniques. To measure the surface area (and pore volume) for these slurries, the pH is adjusted to minimize surface area reduction that can occur during drying. The slurries also have to be dried to make these measurements and are dried using conventional techniques, e.g., heating the slurries to about 90 to about 130° C. for periods long enough to dry the slurry to a powder.

The examples below show that the abrasivity of silica slurries, as measured by silicon dielectric removal rates, can be varied along a relatively wide range of hardnesses. The examples below show that silica removal rates of at least 150, at least 200 and at least 250 mm per minute can be obtained. This method is an advantage when a manufacturer is faced with polishing a variety of materials and each of the materials require a different abrasive material and/or polishing rate. With Applicant's invention, the slurries used to polish these materials can be prepared from one material, e.g., silica, without having to add other essential abrasives. Accordingly, once the slurry has been adjusted to a suitable pH, the slurry of the invention can consist essentially of dispersing medium and the inorganic oxide particles of the invention.

(4) The Final Abrasive Slurry

As indicated earlier, substantially all of the particle size distribution for the final abrasive slurry should be less than one micron. The data below indicates that the particle size distribution of the slurry after heating is substantially the same as the distribution of the slurry after milling. Preferred embodiments have a median particle size less than 0.5 microns and in the range of 0.1 to about 0.3 microns. The particle size distribution is measured using conventional light scattering instrumentation and methods. The sizes reported in the Examples were determined by a LA900 laser scattering particle size analyzer from Horiba Instruments, Inc.

The solids content of the dispersion varies and depends on the solids content of the feed particle dispersion. The solids content of the dispersion is generally in the range of 1–30% by weight and all other ranges encompassed therein. A solids content in the range of 10 to 20% by weight is particularly suitable when using silica gel as slurries for polishing silica insulating dielectric layers. In general, the dispersion's solids content and the dispersion's viscosity should be such that the dispersion easily flows between the wafer to be polished and the polishing pad used to polish the wafer.

The pH of the slurry is dependent upon the inorganic oxide selected and the substrate to be planarized by the slurry. Silica slurries of this invention are particularly suitable for polishing copper when used with silica dielectric insulating layers. Silica dielectric layers prepared from tetraethoxysilane (TEOS) are illustrative. Slurries for polishing copper usually are adjusted to a pH in the range of 4–6 but they can be operable over a more general range of 3–6.5. The pH can be adjusted using standard pH modifiers such as nitric acid to lower the pH of a basic abrasive particle dispersion prepared from silica. As indicated earlier, stable silica dispersions typically have a pH of about 9–10. The pH can be modified to the desired pH as the final slurry is made or it can be modified just prior to being used. For a slurry which is modified to the appropriate pH at a time well before the slurry is used, stabilizing agents can be added to maintain the slurry's stability.

The oxidizing agent used in the invention is preferably an inorganic or organic per-compound. A per-compound as defined by *Hawley's Condensed Chemical Dictionary* is a compound containing at least one peroxy group (—O—O—) or a compound containing an element in its highest oxidation state. Examples of compounds containing at least one peroxy group include, but are not limited to, hydrogen peroxide, urea hydrogen peroxide, dipersulfates ($S_2O_8$=), peracetic acide, percarbonates, organic peroxides such as benzoyl peroxide, and di-t-butyl peroxide, mixtures thereof and either as is or in the form of their respective acid, salts, and adducts. Other suitable oxidizing agents include periodic acid, periodiate salts, perbromic acid, perbromate salts, perchloric acid, perchloric salts, perboric acid, perborate salts, pennanganates, permanganate salts, and chromate salts.

Monopersulfates ($SO_5=$) are also suitable oxidizing agents and include compounds which include the oxidizing $SO_5=$ group as shown below.

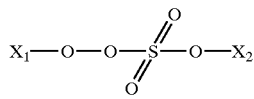

where $X_1$ and $X_2$ are each individually H, $(Si(R')_3$, $NH_4$, $N(R'')_4$ and alkali earth metals such as Li, Na, and K; where R' is an alkyl group, preferably having from 1 to 10 carbon atoms, and wherein R' is H, alkyl group, aryl group, or mixtures thereof including, for example, wherein $N(R'')_4$ is $NMe_4$, $NBu_4$, $NMeBu_3$, $NHEt_3$ and so forth. Suitable classes of monopersulfates include combinations of $KHSO_5$, $KHSO_4$ and $K_2SO_4$. Another suitable monopersulfate oxidizing agent is ammonium persulfate. Other oxidizing agents include nitric acid and derivatives of nitric acid; salts of transition metals such as potassium ferricyanide; and organic oxidizing agents such as nitrobenzene.

The oxidizing agent may be present in the overall chemical mechanical polishing slurry in an amount ranging from about 0.1 to about 20.0 weight percent. It is preferred that the agent is present in the slurry in an amount ranging from about 0.2 to about 10.0 weight percent.

Figure 1B:
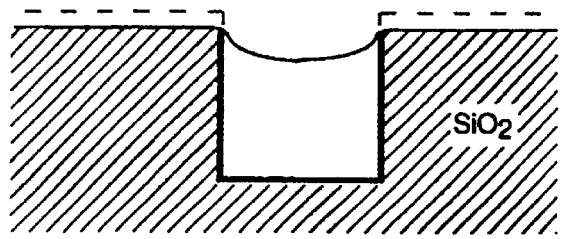
Figure 1C:
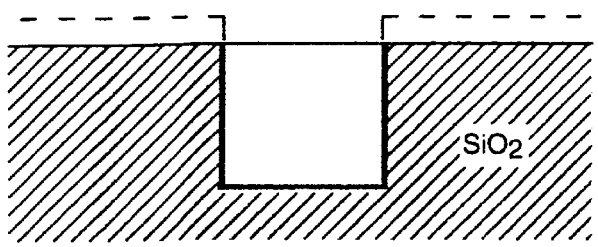

As indicated earlier, the dispersions of the invention are preferably designed for polishing conductive metal surfaces on semiconductor wafers wherein these surfaces are part of integrated circuits constructed with dielectric insulating and/or barrier layers. As discussed earlier, these layers comprise materials which polish at different rates, thereby creating the potential for dishing as illustrated in FIG. 1. The slurries of this invention are particularly suitable for polishing, but can be used on other conductive metals such as tungsten. They are especially suitable in a damascene process in which semiconductors are constructed from copper and a silica based dielectric layer, e.g., that prepared from TEOS, and a barrier layer such as that comprising tantalum (Ta) or tantalum nitride (TaN). The slurry of the invention can be used as the sole slurry for removing copper overburden, or as the first or second slurries mentioned earlier with respect to the discussion of the damascene process.

In general the slurries of this invention generally impart relatively equal removal rates for copper, TEOS and any Ta or TaN present, with the polish rates of each (when polished using the invention) being at least seventy (70%) of the other, i.e., the removal rate of removing TEOS and TaN do not differ by more than 30% from the copper removal rate. Indeed, the examples below show selectivity rates for a copper, TEOS and TaN in which the rate of one is at least 80% of the other, i.e., the rates do not differ by more than 20%.

A variety of additives, such as surfactants, polymeric stabilizers or other surface active dispersing agents, can be added to the inventive dispersion to stabilize it against settling, flocculation and decomposition of the oxidizing component. Examples of suitable surfactants are disclosed in Kirk-Othmer, *Encyclopedia of Chemical Technology*, 3rd Edition, Vol. 22 (John Wiley & Sons, 1983); Sislet & Wood, *Encyclopedia of Surface Active Agents* (Chemical Publishing Co., Inc., 1964) and available manufacturing literature, including for example McCutcheon's *Emulsifiers & Detergents, North American and International Edition* (McCutcheon Division, The MC Publishing Co, 1991); Ash, *The Condensed Encyclopedia of Surfactants* (Chemical Publishing Co., Inc., 1989); Ash, *What Every Chemical Technologist Wants to Know About . . . Emulsifiers and Wetting Agents, Volume I* (Chemical Publishing Co., Inc. 1988); Tadros, *Surfactants (Academic Press,* 1984); Napper, *Polymeric Stabilization of Colloidal Dispersion* (Academic Press, 1983); and Rosen, *Surfactants & Interfacial Phenomena*, 2nd edition (John Wiley & Sons, 1989), all of which are incorporated herein by reference. A surfactant consisting of a copolymer of polydimethyl siloxane and polyoxyalkylene ether is suitable. Such stabilizers are used in amounts ranging from 0.001% to about 0.2% by weight.

The slurries of this invention can be used with conventional polishing equipment and pads. The examples below illustrate the performance of this invention using a Strasbaugh 6CA polisher unit using a SUBA 500 pad or a SUBA 1C1400 pad. These examples, however, are merely illustrative of certain embodiments of the invention and are not intended to any way limit the scope of this invention as recited in the claims appended hereto.

ILLUSTRATIVE EXAMPLES

Examples 1–3 show the flexibility in adjusting abrasiveness of the inventive dispersions with respect to removal rates of insulating layers.

Example 1

Preparation of Base Silica Gel Slurry

Approximately 30 gallons of an aqueous suspension of an intermediate density (ID) hydrous gel were prepared. The term "ID gel" is used to refer to hydrogel which is washed in a pH range of 5–10 after it has been initially formed and as a result has a density which is slightly less than gels prepared from hydrogels which are washed under more acidic conditions. These latter gels are referred to as regular density (RD) gels.

A slurry was prepared by dispersing the ID hydrogel, milling it in an ACM mill and partially drying the hydrogel to prepare a hydrous silica gel having a 55% by weight total volatiles content.

The hydrous gel slurry was then milled further in a NETZSCH media mill (12 liters, 1.2 mm zirconium silicate media) at a rate of 1 gallon per minute.

This milled slurry was then centrifuged using a Dorr-Oliver disc-nozzle type centrifuge (9.3 inch disc diameter) at about 9000 rpm's (correlates to about 10,000 G's). The resulting slurry was designated as Base Silica Slurry A. Base Silica Slurry A was measured to have 90% of the particles at or below 0.4 microns.

A second sample of a similar gel was prepared, except that the hydrous silica gel slurry had a 50% by weight total volatiles content. This hydrous gel slurry was then media milled using the same NETZSCH mill while being fed at 0.2–0.25 gallon per minute. This milled slurry was then centrifuged under more severe conditions to yield a finer particle size colloid designated as Base Silica Slurry B. Specifically, this slurry was centrifuged a second time at 90 minutes at around 1,500 G's. The particle size distribution of Silica Slurry B was measured to have 90% particles at or below 0.2 microns.

|  | Silica Slurry A | Silica Slurry B |
|---|---|---|
| Silica Concentration (% solids by weight) | 17% | 16% |
| Particle Size, $\mu$ |  |  |
| 10%< | .14 | .09 |
| 50%< | .23 | .12 |
| 90%< | .40 | .17 |
| $N_2$ BET Surface Area, $m^2/g$ | 219 | 232 |
| $N_2$PV (.967 P/Po), cc/g | .96 | .62 |

Example 2

Autoclaving of Submicron Silica Gel Suspensions

Three 3 gallon samples of the Base Silica Slurry A and one 3 gallon sample of Base Silica Slurry B were diluted to approximately 12.7% solids, pH adjusted to 9.5 (KOH), then sealed in a stainless steel bomb and then aged at the time/temperature conditions given in the table below. Particle size, pH, and $N_2$ porosimetry evaluations of the autoclaved products are also given. The slurries were adjusted to a pH of 6 before drying and conducting the $N_2$ porosimetry measurements. This adjustment minimizes surface area reduction during the drying process necessary to measure the surface area, thereby making the measurements more accurate. The samples were dried for these measurements using conventional techniques, e.g., heating the slurry to 105° C. until dry. Autoclaving results in a significant surface area loss for each of the base silica suspensions, but substantially no change in particle size.

Example 4

Preparation of Abrasive Slurries for Copper Polishing

Approximately fifty (50) gallons of a silica xerogel powder (Grace Syloid 63) was suspended as an aqueous slurry (~20% solids) and adjusted to pH 9.0 with KOH. The slurry was then media milled and centrifuged resulting in a slurry of approximately 12% solids with a median particle size of 0.21 $\mu$. Twenty-four gallons of this slurry were then autoclaved for 27 hours at 150° C. The resulting autoclaved slurry and a second slurry from the above preparation which had not been autoclaved (i.e., the "non-autoclaved slurry" referred to below) were adjusted to a pH of 4 with nitric acid.

Autoclaving of Submicron Silica Gel
W•500 ID Hydrous Gel Base

| Sample | Autoclave Condition | | Size, $\mu$ | | | pH | % solids | $N_2$PV (cc/g) | BET SA ($m^2/g$) |
|---|---|---|---|---|---|---|---|---|---|
| | Hrs. | ° C. | 10%< | 50%< | 90%< | | | | |
| Base Silica A | — | — | .14 | .23 | .40 | | 16.6 | .96 | 219 |
| A-1 | 30 | 125 | .13 | .24 | .40 | 10.8 | 12.6 | .55 | 83 |
| A-2 | 25 | 150 | .15 | .26 | .42 | 10.7 | 12.8 | .51 | 59 |
| A-3 | 28 | 170 | .16 | .27 | .45 | 10.8 | 12.7 | .27 | 42 |
| Base Silica B | — | — | .09 | .12 | .17 | | 16.1 | .62 | 232 |
| B-1 | 16 | 120 | .09 | .12 | .17 | 10.7 | 12.6 | .44 | 110 |

Example 3

Evaluation of Autoclaved Slurries for $SiO_2$ Polish Rate

Prior to polishing rate evaluation, a sample of the Base Silica Slurry A was diluted with DI water to 12.7% solid. This is the data reported for Base Silica A in FIG. 1. Then this sample and each of the autoclaved slurries A-1 through A-3 and B-1 were adjusted to a pH range of 10.7–10.9 with KOH.

These samples and a sample of a commercial slurry of fumed silica (ILD 1300 slurry from Rodel) were evaluated for $SiO_2$ removal rate using 4 inch $SiO_2$ coated Si wafers. Polish rate tests were made using a Strasbaugh 6CA polisher with a SUBA 500 pad employing a two minute polish time. The distance between the center of the polishing pad and the center of the wafer was set at five inches. Different polishing conditions (pressure (P), and angular velocity (V) of the polishing pad) were used. These conditions and the results are reported in FIG. 2 showing $SiO_2$ polish (removal) rate for the base silica slurries as a function of polishing severity (pressure times angular velocity of the polishing pad). Pressure is presented as pounds per square inch (psi) and angular velocity is presented as revolutions per minutes (rpm).

The data show a significant increase in polish rate with increase in autoclave severity. The rates range from approximately 50% of the commercial polish slurry rate for the non-autoclaved silica gel product to approximately twice the rate for the commercial polish slurry rate.

Figure 3:
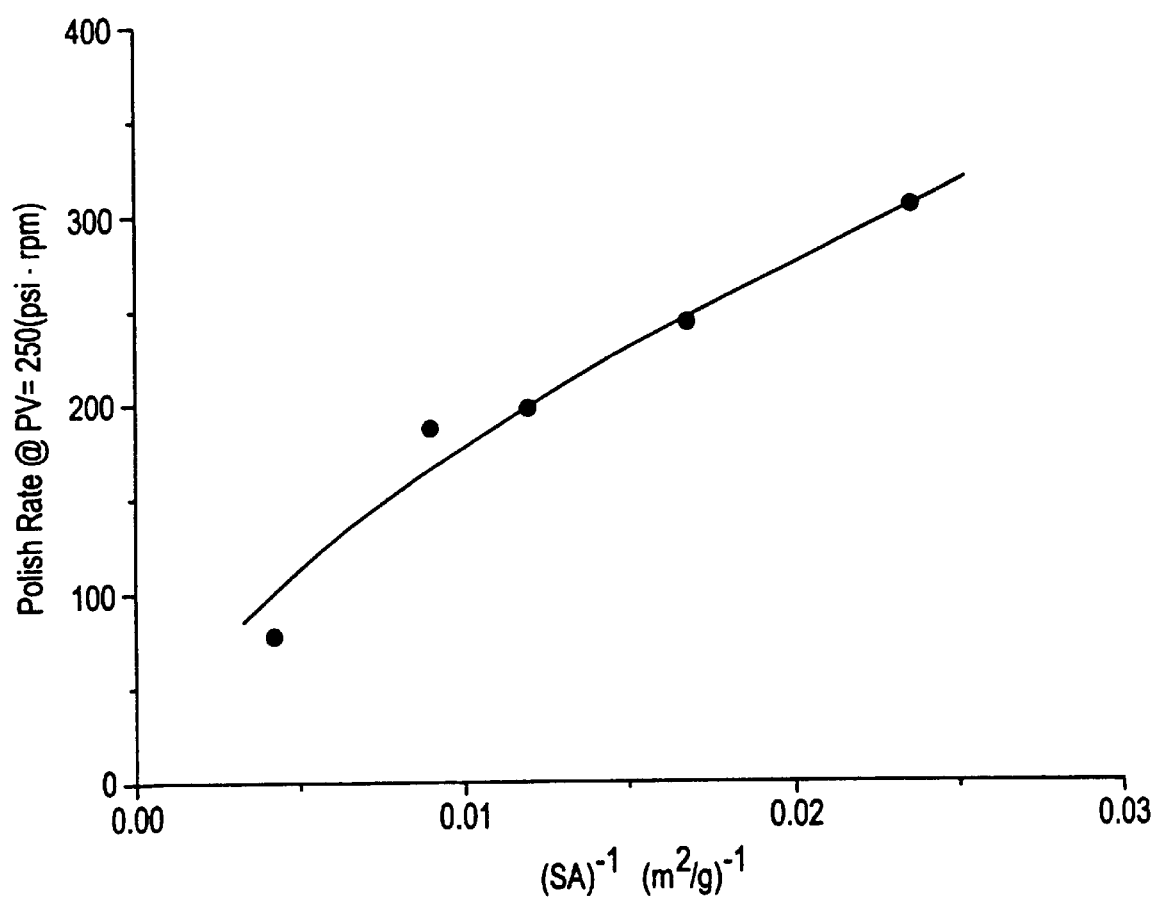
FIG. 3 is a graph indicating that the abrasiveness of a slurry, as reflected in material removal rate, is related to the particle surface area (SA) of the slurry at a constant P·V. The surface area is plotted as an inverse of the actual BET surface area measured.

Furthermore, a strong correlation between observed polish rate and reciprocal surface area of the autoclaved silica gel slurries is shown in FIG. 3. This data indicates that the abrasiveness of inorganic oxide particles can be adjusted by altering the surface area of the particles using the autoclave and modifying the conditions to obtain a certain surface area and the abrasive properties associated with that particular surface area.

Concentrated hydrogen peroxide was added to the slurries in an amount to yield a final slurry concentration of 10% $SiO_2$ and 5% $H_2O_2$. Analysis of the slurries is given in the table below.

| | Slurry A Autoclaved | Slurry B Non-Autoclaved |
|---|---|---|
| $SiO_2$ Content, % | 10 | 10 |
| pH | 4 | 4 |
| $H_2O_2$ Content, % | 5 | 5 |
| Particle Size, $\mu$ | | |
| 10%< | .13 | .13 |
| 50%< | .20 | .21 |
| 90%< | .32 | .36 |
| 99.9%< | .56 | .70 |
| BET Surface Area $m^2/g$ | 53 | 124 |

Example 5

Copper, Barrier (TaN), and Insulation (TEOS) Removal Rates

Both the autoclaved and non-autoclaved slurries were evaluated for copper, barrier and $SiO_2$ dielectric (TEOS) removal rates: These evaluations were made using a Strasbaugh 6CA polisher with a grooved 1C1400 pad at conditions of 6 psi and 40 rpm. For comparison, a commercially available colloidal silica-based Klebosol 30H25 slurry was also evaluated. Chemical and particle size analyses of this sample are not available. Polishing rate data are given in the following table. Values normalized with respect to the copper removal rate are given in parentheses.

| | Polishing Rate (Selectivity) Comparison Removal Rate, nm/min | | |
|---|---|---|---|
| | Slurry A (Autoclaved) | Slurry B (Non-Autoclaved) | Commercial Copper Polishing Slurry-Klebosol 30H25 |
| Copper | 111 (1.00) | 114 (1.00) | 72 (1.00) |
| Barrier (TaN) | 126 (1.14) | 109 (0.96) | 43 (0.60) |
| Dielectric (TEOS) | 103 (0.93) | 43 (0.38) | 24 (0.33) |

With the autoclaved slurry, both the barrier and the TEOS polish rates are within 15% of the copper polish rate. Both the non-autoclaved silica slurry and Klebosol slurry have dielectric polish rates that are less than 40% of the copper polish rate.

What is claimed:

1. A slurry comprising
   (a) dispersing medium,
   (b) porous inorganic oxide particles
      wherein a slurry of these particles has abrasive properties such that a slurry consisting of water and the inorganic particles having a solids content of 12.6% by weight and pH of about 10.8 removes silica at a rate of at least 120 nm/minute, and
   (c) oxidizing agent.

2. The slurry of claim 1 wherein the inorganic oxide particles have a BET surface area in the range of 40 to 120 $m^2/g$ and the removal rate of silica is in the range of 150 to 250 nm/minute.

3. The slurry of claim 2 wherein the dispersing medium is water and the inorganic oxide particles comprise silica.

4. The slurry of claim 3 wherein the silica comprises silica gel.

5. The slurry of claim 2 wherein the silica has a pore volume in the range of 0.2 to 0.6 cc/g.

6. The slurry of claim 1 wherein the silica has a BET surface area of 60 $m^2/g$ or less.

7. The slurry of claim 1 wherein the median particle size of the inorganic oxide particles is in the range of 0.1 to about 0.5 micron and substantially all of the particle size distribution is below one micron.

8. The slurry of claim 1 wherein the inorganic oxide particles are selected from the group consisting of silica gel, fumed silica, precipitated silica, and alumina.

9. The slurry of claim 8 wherein the slurry is prepared by heating silica gel to at least 100° C.

10. The slurry of claim 9 wherein the slurry is prepared in an autoclave.

11. The slurry of claim 1 wherein the oxidizing agent comprises hydrogen peroxide.

12. A slurry comprising:
   (a) dispersing medium,
   (b) inorganic oxide particles having a BET surface area in the range of 40 to 120 $m^2/g$, a pore volume in the range of 0.2 to 0.6 cc/g, and a median particle size in the range of 0.1 to 0.5 microns, and
   (c) oxidizing agent.

13. A slurry of claim 12 wherein the slurry contains 1–30% solids.

14. A slurry of claim 13 wherein at a ph of 4 and a 10% solids content the slurry removes copper at a rate which differs by at most 30% from the slurry's rate of removing tetraethoxysilane.

* * * * *